3,130,325

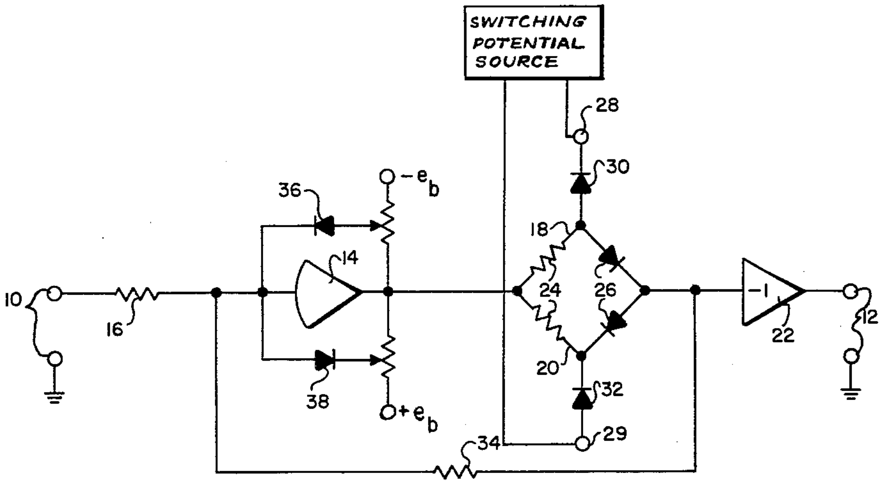
FIG. I.
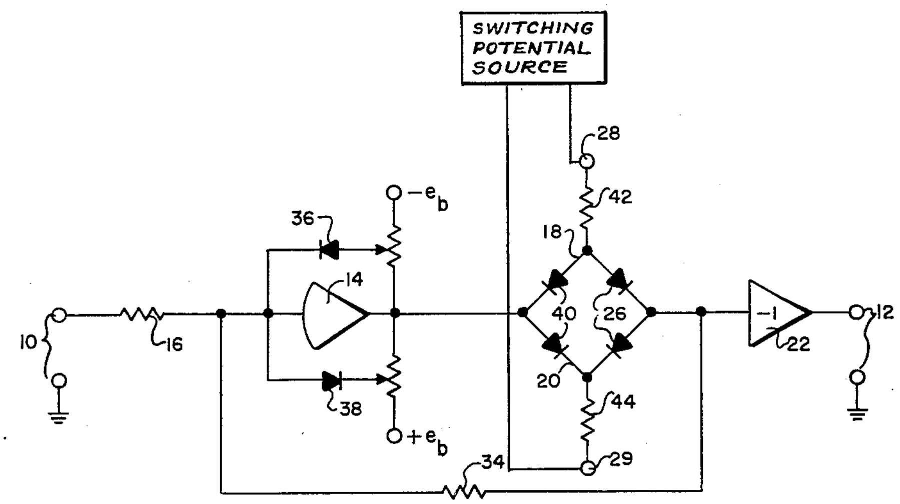
FIG. II.
INVENTORS.
WALTER BRUNNER
JAY P. LANDAUER
ARTHUR I. RUBIN
BY E. A. Petko
ATTORNEY

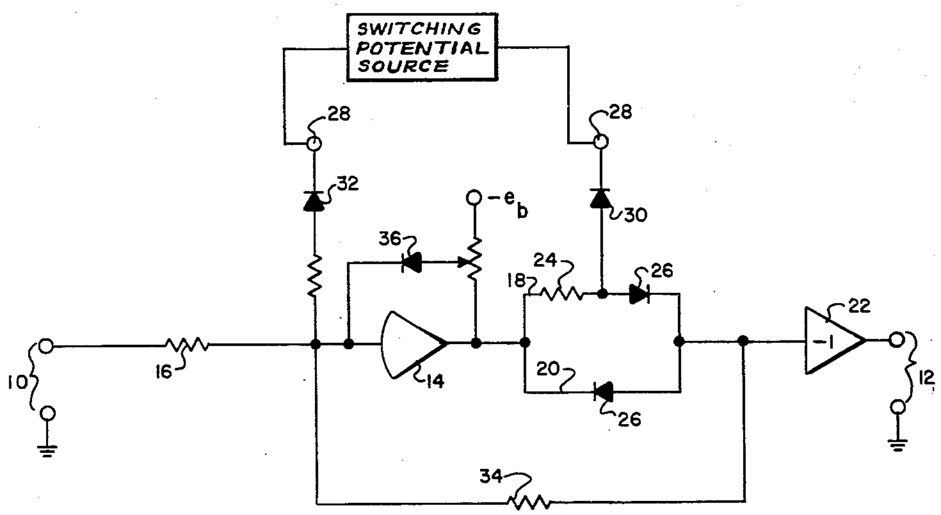
FIG. III.
INVENTORS.
WALTER BRUNNER
JAY P. LANDAUER
ARTHUR I. RUBIN
BY E. A. Pelton
ATTORNEY United States Patent Office 3,130,325
Patented Apr. 21, 1964

ELECTRONIC SWITCH HAVING FEEDBACK COMPENSATING FOR SWITCH NONLINEARITIES

Arthur I. Rubin, East Brunswick, Jay P. Landauer, Monmouth Junction, and Walter Brunner, Princeton, N.J., assignors to Electronic Associates, Inc., Long Branch, N.J., a corporation of New Jersey Filed Aug. 1, 1960, Ser. No. 46,578
5 Claims. (Cl. 307—88.5)

This invention relates generally to electronic switches and more particularly to diode switches employed with feedback amplifiers for selectively switching input signals.

Diode switch circuits heretofore known generally suffer from the disadvantage of loading the external circuit which is being switched and, therefore, they are suitable for switching only low impedance circuits. It is necessary to use a minimum current through the diodes when they are conducting in order to minimize the loading effect and this results in a varying switch resistance due to the variable diode resistance at low currents. As a result of this varying switch resistance, prior art diode switch circuits are generally considered to be non-linear devices which introduce substantial inaccuracies into the switched signals.

It is an object of the present invention to provide electronic switches which largely overcome the enumerated limitations of prior art devices.

It is another object of the present invention to provide electronic switches which are linear in operation in their closed position.

A further object of the present invention is to provide electronic switches which are suitable for switching high as well as low impedance circuits.

Another object of the present invention is to dispose switching diodes in the feedback path of a high gain amplifier in order to eliminate switching errors occasioned by diode voltage drop and resistance variations.

In accordance with the present invention, there is provided an amplifier including input and output terminals. An amplifier feedback circuit is provided between the input terminals and the output terminals and includes a diode bridge. Means providing a switching signal are connected to bias the diode bridge between conditions of conduction and non-conduction. A second feedback circuit is also connected between the input and output terminals of the amplifier and is operative to provide a feedback signal for the amplifier only when the diode bridge is biased to one condition of conduction.

These and other objects, features and advantages will become apparent from the following description taken in connection with the accompanying drawings wherein:

FIG. I is a schematic circuit diagram of one form of an electronic switch according to the present invention;

FIG. II is similar to FIG. I illustrating another form of an electronic switch according to the present invention; and FIG. III is similar to FIG. I illustrating still another form of an electronic switch according to the present invention.

Referring now to FIG. I, there is shown a preferred embodiment of the switch of the present invention which is suitable for selectively switching an input signal which may range through all values, both positive and negative. The input signal to be switched is connected to input terminals 10 and the switched signal is obtained at output terminals 12.

A high gain-direct coupled amplifier 14 has its input stage connected directly to the terminals 10 through an input resistor 16. The output stage of amplifier 14 is connected via a pair of parallel circuits 18, 20 to the input stage of an operational amplifier 22. Amplifier 22 through proper arrangement of input and feedback elements imparts a gain of —1 to an applied signal, as is well known, so that the signal at the terminals 12 is of the same polarity as the input signal. The output stage of amplifier 22 is connected directly to the output terminals 12.

The pair of parallel circuits 18, 20 each comprise a series circuit arrangement of a similar resistor 24 and a similar diode 26. Diode 26 in circuit 18 is connected in an opposite sense to diode 26 in circuit 20, and as is apparent, an applied signal of one polarity will be passed by the circuit 18 while an applied signal of a second or opposite polarity will be passed by the circuit 20.

A source of bi-polar switching potential, not shown, is connected via the similar terminals 28, 29 and a similar diode element to the juncture of each resistor 24 and diode 26. To this end, the resistor-diode juncture of circuit 18 is connected to the anode of a diode 30; the resistor-diode juncture of circuit 20 is connected to the cathode of a diode 32. When diode 30 is conducting, a negative potential is applied to the anode of diode 26 in circuit 18 to render this diode non-conducting. Similarly, when diode 32 is conducting, a positive potential is applied to the cathode of diode 26 in circuit 20 to render this diode non-conducting. The source of switching potential applied to the terminals 28, 29 is such that at any given time one polarity of potential is applied to one of the terminals while an opposite polarity of potential is applied to the other of the terminals.

A first degenerative feedback path is provided for the amplifier 14 through the parallel circuits 18, 20 and through a resistor 34, shown to be connected between the input stage of amplifier 14 and the juncture of the diode 26. A second degenerative feedback path is provided for the amplifier 14 through a pair of diode elements 36, 38, shown to be connected between the input and output stages of the amplifier. It will be noted that diode 36 is connected in an opposite sense to diode 38, and that each of the diodes are provided with a source of biasing potential, shown as $+e_b$, $-e_b$, which is applied to the diodes through suitable potentiometers.

The amplifier 14 is operated degeneratively by the circuit thus far described to maintain its input terminals substantially at ground potential and to produce an output potential which is a non-linear function of the potential input at the terminals 10. The relationship, however, between the input potential $E_i$ and the output potential $E_o$ obtained at the junction of diodes 26 is given by the well-known expression $$E_o = -\frac{R_f}{R_i} E_i$$

where $R_f$ is the value of the feedback resistor 34 and $R_i$ is the value of the input resistor 16. It is apparent from this expression that the output potential $E_o$ is completely independent of any voltage drops which may be obtained across the diodes 26 or the resistors 24 and, if $R_f$ is selected to be equal to $R_i$, $E_o$ will be equal in magnitude to $E_i$.

In an inactive or open condition of the present switch a negative potential is applied to the diode 30 via the terminal 28 and a positive potential is applied to diode 32 via the temrinal 29. Both of the diodes 26 are thus biased to a condition of non-conduction to prevent passage of an output signal from amplifier 14. The only requirement imposed upon the source potential applied to terminals 28, 29 is that its magnitude, positive or negative as the case may be, shall be greater than the usual potential output from amplifier 14 expected to appear at the juncture of the diodes 26 and resistors 24 as determined by the voltage dividers comprising the resistors 24 and corresponding diodes 30 or 32.

In this inactive or open condition of the diodes 26, and with a positive polarity input signal applied to the terminal 10, the path of current flow will be from the terminals 10 through resistor 16, amplifier 14, and through the diode 38 to the input stage of amplifier 14. With a negative polarity input signal applied to terminals 10, the path of current flow will be from the terminals 10 through resistor 16, amplifier 14, and through the diode 36 to the input stage of amplifier 14. Either the diode 36 or the diode 38 will conduct while the diodes 26 are maintained in their non-conducting condition to prevent the amplifier 14 from operating in an open-circuited condition. The resistance ratio of the potentiometers and the amplitude of the biasing sources $-e_b$ and $+e_b$ are selected to prevent conduction of the diodes 36, 38 except when the output from amplifier 14 exceeds permissive limits. Thus, during normal operation of amplifier 14 with feedback, the diodes 36 and 38 will not conduct. Conduction of either diode 36 or diode 38 will occur only when the diodes 26 present an open circuit to the output signal from amplifier 14 or when, for example, excessive input signals are applied to terminals 10.

In order to close the switch of the present invention, viz., connect the amplifier 14 to the amplifier 22, the polarity of the switching potential is reversed at the terminals 28, 29 and in turn at the diodes 30, 32. The diodes 30, 32 will now be reverse or back biased and the reverse or back bias will be removed from the diodes 26. The diodes 26 will now conduct responsive to an applied potential of the proper polarity appearing at the juncture of resistors 24 and diodes 26. Thus, positive polarity signals will be passed by the diode 26 in circuit 18 while negative polarity signals will be passed by the diode 26 in circuit 20. If the output from amplifier 14 exceeds the biasing or switching potential applied to diodes 30, 32, the diodes 30, 32 will conduct, and the input to the amplifier 22 will be limited in magnitude to that of the switching potential. If the switch of this embodiment is to be utilized with input potentials of only one polarity, it is apparent that one or the other of the parallel circuits 18, 20 and the corrseponding diode 30 or 32 may be eliminated.

In the description of the embodiments of FIGS. II and III similar parts will be labelled with similar reference numerals. Turning now to the embodiment of FIG. II, the electronic switch is seen to differ from the embodiment of FIG. I only in the arrangement of the diode bridge and switching diodes. The pair of resistors 24 are seen to be replaced by a pair of oppositely poled diodes 40.

The juncture of the diodes 40 and 26 in circuit 18 is connected to the source of switching potential at terminal 28 through a resistor 42; a similar resistor 44 similarly connects the juncture of diodes 40 and 26 in circuit 20 to the source of switching potential at the terminal 29. As is apparent, the diode bridge is disposed within the feedback loop of amplifier 14 and the variable resistance characteristics of the diodes will not affect the output voltage appearing at the junction of diode 26.

In the quiescent or open condition of the switch of this embodiment a negative switching potential is applied to resistor 42 via the terminal 28 and a positive switching potential is applied to the resistor 44 via the terminal 29. All of the diodes 40, 26 are seen to be reversed or back biased and will not conduct responsive to an output signal from the amplifier 14. In this condition of the switch, as in the embodiment of FIG. I, a feedback path is provided for amplifier 14 through the diodes 36, 38.

In order to close the switch of FIG. II, the switching potential applied to resistors 42, 44 via the terminals 28 is reversed. The diodes 40, 26 become forward biased and current will now flow from the now positive terminal 28 through resistor 44, the diodes 26, the diodes 40 and through the resistor 42 to the now negative terminal 29. Balanced currents will appear in each of the legs of the diode bridge so long as the four diodes 40, 26 have similar characteristics.

If, at this time, a negative signal appears at the junction of diodes 40, the diode 40 connected to resistor 42 will conduct more heavily than the other diode 40. The diode bridge will become unbalanced, as is well known, and the diode 26 connected to resistor 44 will now conduct more heavily than the other diode 26. Consequently, a signal equal to the negative signal applied to the diodes 40 will now flow from the juncture of diodes 26 for application to the input stage of amplifier 22. A positive signal is similarly passed by this diode bridge.

As in the embodiment of FIG. I, the magnitude of the signal applied to amplifier 22 is limited to that of the switching potential. Moreover, in this embodiment, the input signal to amplifier 22 is further limited by the ratio of either resistor 42 or 44 to the sum of resistor 34 and the input resistor to amplifier 22, not shown.

In the embodiment of FIG. III, the diode 38 and corresponding potentiometer have been eliminated. Similarly, one of the resistors 24 have been eliminated. Although each of the eliminated elements correspond to the circuit which would normally conduct the negative output from amplifier 14, the corresponding positive conducting elements could be eliminated instead if the polarity of the switching potentials at terminals 28 were reversed. The diodes 30, 32 in the present embodiment are poled in a similar manner to that of the embodiment of FIG. I and have their respective anodes connected directly to the diode resistor juncture in circuit 18 and the input terminal of amplifier 14.

In the quiescent or open condition of the switch of this embodiment a negative switching potential is applied to both terminals 28, and a negative switching potential reverse or back biases the diodes 26 in circuit 18. A negative switching potential is also applied to the input terminal of amplifier 14, and is of a character to saturate or swamp the amplifier 14 through the feedback circuit, diode 36, irrespective of the amplitude or polarity of the signal applied at terminal 10. Diode 26 in circuit 20, it will be noted, will not conduct responsive to the positive polarity output from amplifier 14 and consequently no signal is applied to the input stage of amplifier 22.

When the switching potential is reversed at the terminals 28, the diodes 30, 32 become reverse or back biased and will not conduct. With the switching potential removed from the input stage of amplifier 14 and the anode of diode 26, either polarity of the output from amplifier 14 being applied to the circuits 18, 20 will be passed by the diodes 26 and applied to the amplifier 22 for phase inversion.

While only three embodiments of the invention have been shown and described herein and inasmuch as this invention is subject to many variations, modifications and reversals of parts, it is the intent that all matter in the above description shall be interpreted as illustrative and not in a limiting sense.

We claim:

1. An electronic switch having signals to be switched applied to an input terminal thereof and the switched signals provided at an output terminal thereof, the combination comprising an amplifier having its input connected to said input terminal, a switching circuit including a plurality of diodes connecting the amplifier output to said output terminals, a first degenerative feedback circuit connected between said output terminal and the input of said amplifier to provide said switching circuit in circuit with an error-cancelling feedback loop to produce at said output terminal said switched signals independent of errors caused by said switching circuit, means providing a switching signal for actuating said switching circuit between conditions of conduction and non-conduction, and a second degenerative feedback circuit connecting the output of said amplifier to its input and normally operative to provide an additional feedback signal for said amplifier only when said switching circuit is in one condition of conduction.

2. An electronic switch having signals to be switched applied to an input terminal thereof and the switched signals provided at an output terminal thereof, the combination comprising an amplifier having its input connected to said input terminal, a diode bridge connected between the output of said amplifier and said output terminal, a first degenerative feedback circuit connected between said output terminal and the input of said amplifier to provide said diode bridge in circuit with an error-cancelling feedback loop to produce at said output terminal said switched signals independent of errors caused by said diode bridge, means providing a switching signal for biasing said diode bridge between conditions of conduction and non-conduction, and a second degenerative feedback circuit connecting the output of said amplifier to its input and normally operative to provide an additional feedback signal for said amplifier only when said diode bridge is biased to one of said conditions of conduction.

3. An electronic switch having signals to be switched applied to an input terminal thereof and the switched signals provided at an output terminal thereof, the combination comprising an amplifier having its input connected to said input terminal, a diode bridge connecting the amplifier output to said output terminals, a first degenerative feedback circuit connected between said output terminal and the input of said amplifier to provide said diode bridge in series circuit relation with an error-cancelling feedback loop to produce at said output terminal said switched signals independent of errors caused by said diode bridge, means providing a switching signal for actuating said diode bridge between conditions of conduction and non-conduction, and a second degenerative feedback circuit connecting the output of said amplifier to its input and normally operative to provide an additional feedback signal for said amplifier only when said diode bridge is in a condition of non-conduction to prevent said amplifier from saturating.

4. An electronic switch having signals to be switched applied to an input terminal thereof and the switched signals provided at an output terminal thereof comprising, an amplifier having its input connected to said input terminal, means including a four-diode bridge connecting the amplifier output to said output terminal, a first degenerative feedback circuit connected between said output terminal and said input of said amplifier to provide said four-diode bridge in series circuit relation with an error-cancelling feedback loop to produce at said output terminal said switched signals independent of errors caused by said switching circuits, means providing switching signals for actuating said four-diode bridge between conditions of conduction and nonconduction, and a second degenerative feedback circuit connecting the output of said amplifier to its input and normally operative to provide an additional feedback signal for said amplifier only when said four-diode bridge is in a condition of nonconduction to prevent said amplifier from saturating.

5. An electronic switch having signals to be switched applied to an input terminal thereof and the switched signals provided at an output terminal thereof comprising, an amplifier having its input connected to said input terminal, a pair of parallel circuits, each including at least one diode element connecting the output of said amplifier to said output terminal, said diode elements being connected to conduct in opposite directions, a first degenerative feedback circuit connected between said output terminal and the input of said amplifier to provide each of said pair of parallel circuits in series circuit relation with an error-cancelling feedback loop to produce at said output terminal said switched signals independent of errors caused by said diode elements, means for applying a switching signal to one of said diode elements and to the input of said amplifier for biasing said one diode element to a condition of nonconduction, and a second degenerative feedback circuit connecting the output of said amplifier and normally operative to provide an additional feedback signal for said amplifier only when said one diode element is in a condition of nonconduction to prevent said amplifier from saturating.

References Cited in the file of this patent

UNITED STATES PATENTS

| | | |
|---|---|---|
| 2,685,039 | Scarbrough et al. | July 27, 1954 |
| 2,775,714 | Curtis | Dec. 25, 1956 |
| 2,831,985 | Eckert | Apr. 22, 1958 |
| 2,962,217 | Landsman | Nov. 29, 1960 |
| 2,982,867 | Wennerberg | May 2, 1961 |

FOREIGN PATENTS

| | | |
|---|---|---|
| 765,954 | England | Jan. 16, 1957 |
| 1,116,650 | France | May 9, 1956 |

OTHER REFERENCES

Electronics, "Function Generation With Operation Amplifiers," by Koerner et al., Nov. 6, 1959, FIG. 7, page 68.

"Electronic Analog Computers," by Korn and Korn, published by McGraw-Hill Book Co., Inc., New York, 2nd ed., 1956, page 142.